(12) United States Patent
Hwang

(10) Patent No.: US 6,438,179 B1
(45) Date of Patent: Aug. 20, 2002

(54) FREQUENCY DEMODULATION APPARATUS AND METHOD

(75) Inventor: In-jun Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/349,372

(22) Filed: Jul. 8, 1999

(30) Foreign Application Priority Data

Nov. 19, 1998 (KR) .............................. 98-49774

(51) Int. Cl.[7] .............................. H03D 3/00; H03K 9/06
(52) U.S. Cl. ..................... 375/322; 375/340; 329/315
(58) Field of Search ................. 375/316, 340, 375/322; 329/315–323, 341, 343; 341/126, 155; 348/491, 504, 572

(56) References Cited

U.S. PATENT DOCUMENTS

| | | | | |
|---|---|---|---|---|
| 4,090,145 A | * | 5/1978 | Webb | 369/111 |
| 4,232,268 A | | 11/1980 | Hinn | |
| 4,400,720 A | | 8/1983 | Hinn | |
| 4,816,928 A | * | 3/1989 | Sasaki et al. | 375/222 |
| 5,194,938 A | | 3/1993 | Imbert et al. | |
| 5,920,589 A | * | 7/1999 | Rouquette et al. | 455/553 |
| 5,995,539 A | * | 11/1999 | Miller | 375/219 |
| 6,006,108 A | * | 12/1999 | Black et al. | 455/553 |
| 6,263,017 B1 | * | 7/2001 | Miller | 375/219 |

FOREIGN PATENT DOCUMENTS

| | | | |
|---|---|---|---|
| EP | 0059133 | 1/1982 | 9/40 |
| EP | 0416367 | 3/1991 | 11/18 |
| EP | 0597160 | 5/1994 | 9/78 |
| FR | 2752503 | 2/1998 | 11/18 |

OTHER PUBLICATIONS

"An Arctangent Type Wide Band PM/FM Demodulator with Improved Performance", Noel Boutin, IEEE Transactions on Consumer Electronics, vol. 38, No. 1, pp. 5–9, (Feb. 1992).

"A Novel FM Demodulation Scheme", Kiranon, et al., IEEE Transactions on Consumer Electronics, vol. 41, No. 4, pp. 1103–1107,(Nov. 1995).

* cited by examiner

*Primary Examiner*—Stephen Chin
*Assistant Examiner*—Lenny Jiang
(74) *Attorney, Agent, or Firm*—Mills & Onello, LLP

(57) ABSTRACT

A frequency demodulation apparatus and a method therefor using an arcsin approximation includes: an analog-to-digital converter (ADC) for sampling a frequency-modulated analog signal to convert the frequency-modulated analog signal into a digital signal, and for outputting the sampled values ($S_0 \sim S_n$) of the digital signal; a first multiplier for multiplying sinusoidal first and second oscillation signals having a phase difference of 90°, by the sampled value $S_i(0 \leq i \leq n)$ respectively, and outputting the products as the signals $I_i$ and $Q_i$; a low pass filter for low-pass-filtering the signals $I_i$ and $Q_i$ and outputting the low-pass-filtered signals $I_i'$ and $Q_i'$; a first de-emphasizer for de-emphasizing the high-frequency components of the signals $I_i'$ and $Q_i'$ and outputting the de-emphasized signals $I_i''$ and $Q_i''$; a frequency differentiator for delaying the signals $I_i''$ and $Q_i''$, multiplying and then subtracting the delayed signals, and outputting the subtraction result as a frequency-demodulated digital signal Z; and a gain corrector for correcting the gain of the signal Z. Efficient frequency demodulation is achieved in a manner especially attractive for SECAM chroma demodulation applications.

19 Claims, 14 Drawing Sheets

FREQUENCY DEMODULATION APPARATUS AND METHOD

BACKGROUND OF THE INVENTION

1. Field of the Invention

The present invention relates to frequency demodulation for demodulating a frequency-modulated signal, and more particularly, to a frequency demodulation apparatus and method for demodulating the signal using an arcsin approximation.

2. Description of the Related Art

A conventional apparatus for demodulating a frequency-modulated analog signal is disclosed in U.S. Pat. Nos. 5,194,938 and 4,232,268, incorporated herein by reference. The disclosed conventional frequency demodulation apparatus is large and complicated due to the need for an accurate phase locked loop (PLL). In addition, the first conventional frequency demodulation apparatus performs analog frequency demodulation which is greatly affected by process parameters, resulting in increased circuit size. Furthermore, in the case where the conventional frequency demodulation apparatus is employed to demodulate a SECAM (SEquential Couleur Avec Memoire or SEquential Color with Memory) color difference signal, frequencies of sub-carriers for the lines corresponding to first and second color difference signals $D_b$ and $D_r$ are different. For this reason, a PLL for each line must be provided.

A second conventional frequency demodulation apparatus has been disclosed in an article entitled "An arctangent type wideband PM/FM demodulator with improved performance", IEEE TRANSACTION ON CONSUMER ELECTRONICS, Vol. 38, No. 1, pp 5–9, in February 1992, incorporated herein by reference. However, the arctangent approximation used in the second conventional frequency demodulation apparatus results in a large amount of error. Furthermore, the second conventional frequency demodulation apparatus requires a look-up table for the arctangent function in order to attain desired performance, the hardware complexity and manufacturing costs increase.

A third conventional frequency demodulation apparatus has been disclosed in an article entitled "A novel FM demodulation scheme", IEEE TRANSACTION ON CONSUMER ELECTRONICS, Vol. 41, No. 4, pp 1103–1107 in November 1995. This technique requires an additional look up table for calculating a square root function, and, as resolution increases, so too must the size of the look-up table, thus once again, increasing hardware complexity and cost.

SUMMARY OF THE INVENTION

To address the above limitations, it is a first object of the present invention to provide a frequency demodulation apparatus for performing frequency demodulation using an arcsin approximation.

It is a second object of the present invention to provide a frequency demodulation method performed in the frequency demodulation apparatus.

It is a third object of the present invention to provide a frequency demodulation apparatus for SECAM (SEquential Couleur Avec Memoire or SEquential Color with Memory) chroma demodulation, which demodulates the frequency of color difference signals transmitted according to the SECAM protocol, using an arcsin approximation.

It is a fourth object of the present invention to provide a frequency demodulation method for SECAM chroma demodulation, performed by the frequency demodulation apparatus for the SECAM chroma demodulation.

Accordingly, to achieve the above first object, there is provided a frequency demodulation apparatus comprising: an analog-to-digital converter (ADC) for sampling a frequency-modulated analog signal to convert the frequency-modulated analog signal into a digital signal, and outputting the sampled values ($S_0$~$S_n$) of the digital signal; a first multiplier for multiplying a sinusoidal first and a second oscillation signals having a phase difference of 90°, by the sampled value $S_i$ ($0 \leq i \leq n$) respectively, and outputting the products as the signals $I_i$ and $Q_i$; a low pass filter for low-pass-filtering the signals $I_i$ and $Q_i$ and outputting the low-pass-filtered signals $I_i'$ and $Q_i'$; a first de-emphasizer for de-emphasizing the high-frequency components of the signals $I_i'$ and $Q_i'$ and outputting the de-emphasized signals $I_i''$ and $Q_i''$; a frequency differentiator for delaying the signals $I_i''$ and $Q_i''$, multiplying and then subtracting the delayed signals, and outputting the subtraction result as a frequency-demodulated digital signal Z; a gain corrector for correcting the gain of the signal Z; and an oscillator for outputting the first and second oscillation signals.

To achieve the second object, there is provided a frequency demodulation method comprising the steps of: (a) sampling a frequency-modulated analog signal to calculate sampled values $S_0$~$S_n$; (b) multiplying first and second oscillation signals that are sinusoidal with a phase difference of 90° by the sampled value $S_i$ ($0 \leq i \leq n$) respectively and obtaining the products $I_i$ and $Q_i$; (c) low-pass-filtering the signals $I_i$ and $Q_i$ to obtain the low-pass-filtered signals $I_i'$ and $Q_i'$; (d) de-emphasizing the high-frequency components of the signals $I_i'$ and $Q_i'$ to obtain the de-emphasized signals $I_i''$ and $Q_i''$; (e) delaying the signals $I_i''$ and $Q_i''$, multiplying and then subtracting the delayed signals to obtain a frequency-demodulated digital signal Z; and (f) correcting the gain of the frequency-demodulated digital signal Z.

To achieve the third object, i.e., for the SECAM chroma demodulation, the frequency demodulation apparatus further comprises: a first selector for selectively outputting the signals $I_i''$ and $Q_i''$ or the signals $I_i'$ and $Q_i'$ in response to a selection signal; a gain adjustor for determining whether the amplitude of the signal $I_i'$ maintains a predetermined value, adjusting the gain of the signal $I_i'$ in response to the determination result, and outputting the gain-adjusted signal to the first multiplier; a line checking unit for checking whether the current line is an even line or odd line using the signal Z, the selection signal and the delayed signals, and outputting the checking result; a second de-emphasizer for de-emphasizing the low-frequency component of the signal output from the gain corrector, and outputting the de-emphasized result; and a color difference signal reproducer for differentiating and outputting the signals for the previous line among the signals output from the second de-emphasizer as a frequency-demodulated first color difference signal and for differentiating and outputting the signals for the current line among the signals output from the second de-emphasizer as a frequency-demodulated second color difference signal, in response to the line checking result of the line checking unit, wherein the analog signal includes the frequency-modulated first or second color difference signal, the color difference signal transmitted being loaded on the odd or even line, the frequency differentiator calculates the signal Z using the result selected by the first selector, (instead of using the signals $I_i''$ and $Q_i''$), the first multiplier multiplies the signals $I_i$ and $Q_i$ by the gain adjusted by the gain adjustor and outputs the products to the low pass filter, the gain corrector corrects the gain and offset of the signal Z in response to the check result of the line checking unit and outputs the corrected result to the second de-emphasizer, and the selection signal is generated during the interval in which a color burst signal exists in the analog signal.

To achieve the fourth object, there is provided a frequency demodulation method for the SECAM chroma demodulation, comprising the steps of: (a) sampling an analog composite video baseband signal with a frequency-modulated first or second color difference signal to obtain sampled values $S_0 \sim S_n$; (b) multiplying third and fourth oscillation signals that are sinusoidal with a phase difference of 90° by the sampled value $S_i$ ($0 \leq i \leq n$) respectively and obtaining the products $I_i$ and $Q_i$; (c) low-pass-filtering the signals $I_i$ and $Q_i$ to obtain the low-pass-filtered signals $I_i'$ and $Q_i'$; (d) delaying the signals $I_i'$ and $Q_i'$, multiplying and then subtracting the delayed signals to obtain a signal Z; (e) determining whether the current line is an even line or odd line using the signal Z, the selection signal and the delayed signals; (f) determining the signals Z for the previous line as a frequency-demodulated first color difference signal if the current line is an even line; and (g) determining the signals Z for the current line as a frequency-demodulated second color difference signal if the current line is an odd line, wherein the frequency-modulated first and second color difference signals are loaded on the odd or even line and transmitted.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Hereinafter, the structure and operation of a frequency demodulation apparatus according to the present invention, and a frequency demodulation method thereof will be described with reference to the appended drawings.

Figure 1:
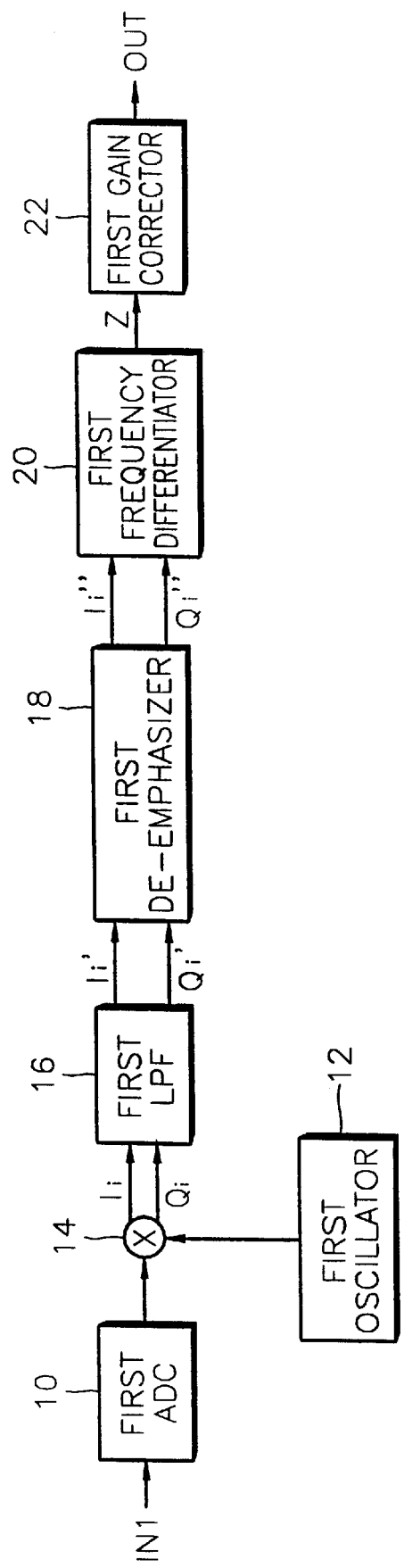
FIG. 1 is a block diagram of a frequency demodulation apparatus according to a preferred embodiment of the present invention.

Referring to FIG. 1, a frequency demodulation apparatus according to a preferred embodiment of the present invention includes a first analog-to-digital converter (ADC) 10, a first oscillator 12, a multiplier 14, a first low pass filter (LPF) 16, a first de-emphasizer 18, a first frequency differentiator 20, and a first gain corrector 22.

Figure 2:
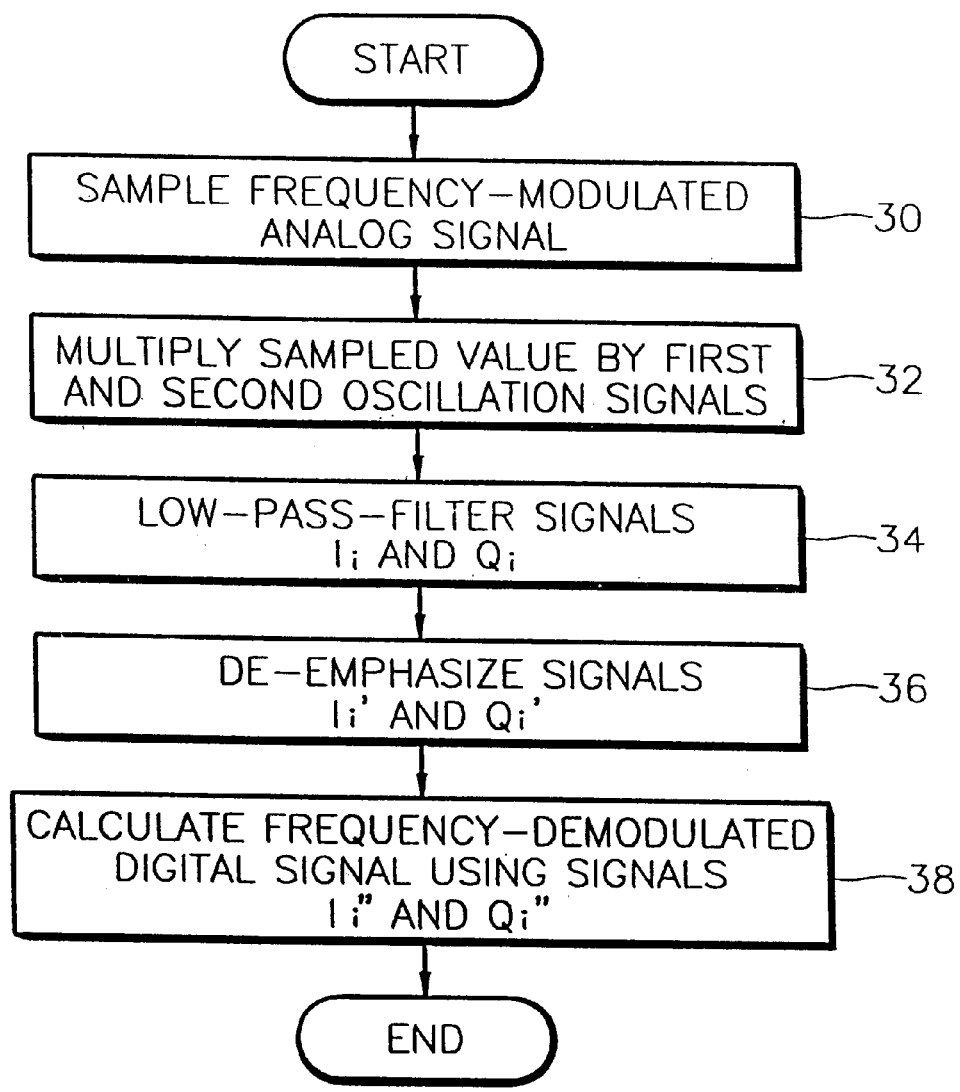
FIG. 2 is a flowchart illustrating a frequency demodulation method according to the present invention, performed in the apparatus shown in FIG. 1.

FIG. 2 is a flowchart illustrating a frequency demodulation method according to the present invention performed in the apparatus shown in FIG. 1, in which a digital signal converted from a frequency-modulated analog signal is frequency-demodulated using an arcsin approximation (steps 30 through 38).

The first ADC 10 of FIG. 1 receives through an input port IN1 an analog signal [X(t)] containing a frequency-modulated message signal [M(t)], which is expressed below as Equation (1), samples the input analog signal [X(t)] in response to a sampling clock signal $CK_s$ to convert it into a digital signal, and outputs sampled values $S_0 \sim S_n$, i.e., the digital signal [X(nT)], expressed below as Equation 2, to the multiplier 14 (step 30).

$$X(t) = A(t) * \cos\left(2\pi f_0 t + k_f \int_0^t M_{(T)} d_T\right) \quad (1)$$

In Equation (1), $f_o$ indicates the carrier frequency of the analog signal [X(t)], and $k_f$ indicates the frequency deviation.

$$X(nT) = Y + A(nT) * \cos\left(2\pi f_0 nT + k_f \sum_{p=0}^{n} M(p)\right) \quad (2)$$

Following step 30, the multiplier 14 multiplies first and second oscillation signals $G_{i1}$ and $G_{i2}$ output from the first oscillator 12, expressed below as Equation (3), by the sampled values $S_i$ ($0 \leq i \leq n$), respectively, and outputs the products $I_i$ and $Q_i$ expressed below as Equation (4) to the first LPF (step 32).

$$G_{i1} = \sin(2\pi f_{SC} iT) \quad G_{i2} = \cos(2\pi f_{SC} iT) \quad (3)$$

In Equation (3), $G_{i1}$ and $G_{i2}$ represent sinusoidal waves with a 90° phase difference and have a predetermined free running frequency $f_{SC}$.

$$I_i = S_i * G_{i1} \quad (4)$$

$$= \left[Y + A(iT) * \cos\left(2\pi f_0 iT + k_f \sum_{p=0}^{i} M(p)\right)\right] * \sin(2\pi f_{sc} iT)$$

$$Q_i = S_i * G_{i2}$$

$$= \left[Y + A(iT) * \cos\left(2\pi f_0 iT + k_f \sum_{p=0}^{i} M(p)\right)\right] * \cos(2\pi f_{sc} iT)$$

In the Equation (4), I represents the "in phase" component and Q represents the "quadrature" component.

Following step 32, the first LPF 16 low-pass-filters the signals $I_i$ and $Q_i$ output from the multiplier 14 and outputs the filtered results $I_i'$ and $Q_i'$, expressed as Equation (5), to the first de-emphasizer 18 (step 34).

$$I_i' = \frac{A(iT)}{2} * \sin\left[2\pi(f_{sc} - f_0)iT - k_f \sum_{p=0}^{i} M(p)\right] \quad (5)$$

$$Q_i' = \frac{A(iT)}{2} * \cos\left[2\pi(f_0 - f_{sc})iT + k_f \sum_{p=0}^{i} M(p)\right]$$

Here, if the free running frequency $f_{SC}$ of the respective first and second oscillation signals is $f_o$, that is, if the free running frequency $f_{SC}$ is identified with the carrier frequency $f_o$ of the frequency-modulated analog signal $[M(t)]$, then Equation (5) can be expressed as Equation (6).

$$I_i' = -\frac{A(iT)}{2} * \sin\left[k_f \sum_{p=0}^{i} M(p)\right] \quad (6)$$

$$Q_i' = \frac{A(iT)}{2} * \cos\left[k_f \sum_{p=0}^{i} M(p)\right]$$

Following step 34, the first de-emphasizer 18 de-emphasizes high frequency components of the signals $I_i'$ and $Q_i'$ output from the first LPF 16, and outputs the de-emphasized results $I_i''$ and $Q_i''$, expressed as Equation (7), to the first frequency differentiator 20 (step 36).

$$I_i'' = B * \sin\left[k_f \sum_{p=0}^{i} M(p)\right] \quad (7)$$

$$Q_i'' = B * \cos\left[k_f \sum_{p=0}^{i} M(p)\right]$$

In Equation (7), B is a value obtained by normalizing $$\frac{A(iT)}{2}.$$

Following step 36, the first frequency differentiator 20 differentiates signals $I_i''$ and $Q_i''$ output from the first de-emphasizer 18 using an arcsin approximation and outputs a frequency-modulated digital signal Z, which is the result of the differentiation, to the first gain corrector 22 (step 38).

Hereinafter, the differentiation using the arcsin approximation will be explained. Here, for utilizing the arcsin approximation, it is assumed that the width $$\left[k_f \sum_{p=0}^{i} M(p)\right]$$

in the frequency deviation of the integrated message signal based on the frequency of the sampling clock signal $CK_S$ is not great.

Figure 3:
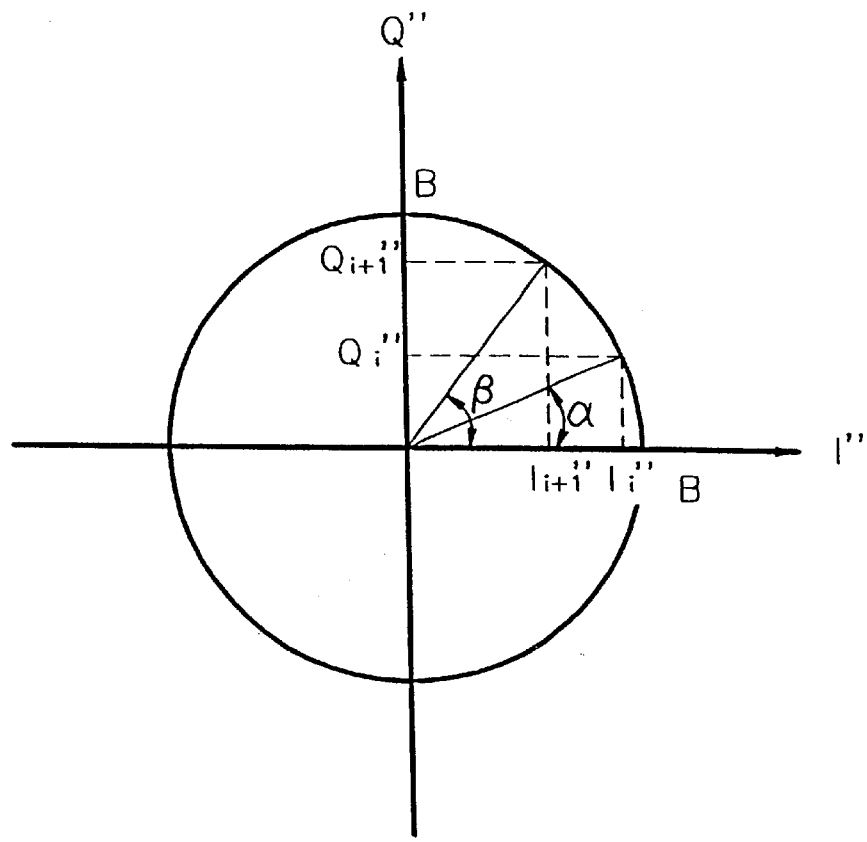
FIG. 3 is a diagram illustrating the principle of differentiation using an arcsin approximation.

FIG. 3 is a diagram illustrating the principle of the differentiation using the arcsin approximation, in which the X-axis indicates the in-phase signal $I_i''$ and the Y-axis indicates the quadrature signal Q".

The sampled values $I_i''$ and $Q_i''$ expressed by Equation (7) and the neighboring sampled values $I_{i+1}'$ and $Q_{i+1}''$ are located on the same circumference, i.e. contour, of a circle as shown in FIG. 3. Thus, assuming that $$\alpha = k_f \sum_{p=0}^{i} M(p) \text{ and } \beta = k_f \sum_{p=0}^{i+1} M(p),$$

the message signal can be extracted by Equation (8) by calculating the angle difference ($\beta-\alpha$) between two neighboring sampled values.

$$I_i'' * Q_{i+1}'' - I_{i+1}'' * Q_i'' = B^2 * \{\sin\beta \cdot \cos\alpha - \sin\alpha \cdot \cos\beta\} \quad (8)$$

$$= B^2 * \sin(\beta - \alpha) = B^2 \sin[k_f M(i+1)]$$

In Equation (8), if $k_f M(i+1)$ is very small, $\sin[k_f M(i+1)]$ approximates $k_f M(i+1)$, which is referred to herein as the arcsin approximation. Here, a frequency-modulated digital signal $[B^2 k_f M(i)](Z)$ is expressed as Equation (9).

$$B^2 k_f M(i+1) = I_i'' * Q_{i+1}'' - I_{i-1}'' * Q_i'' \quad (9)$$

Thus, the first frequency differentiator 20 of FIG. 1 performs the function of Equation (9) obtained through the arcsin approximation in order to differentiate the signals $I_i''$ and $Q_i''$. That is, the first frequency differentiator 20 performs the multiplications and subtraction on signals, $I_i''$ and $Q_i''$, $I_{i+1}''$ and $Q_{i+1}''$ in order to obtain the frequency-demodulated digital signal $[B^2 k_f M(i)]$. The structure and operation of the first frequency differentiator 20 that performs the function of Equation (9) will be explained.

Figure 4:
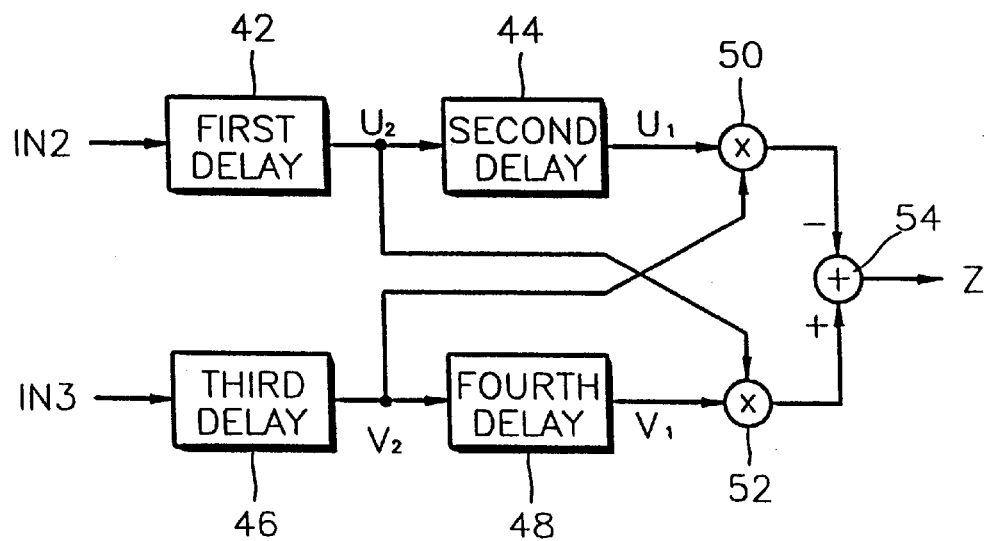
FIG. 4 is a circuit diagram of an embodiment of the first frequency differentiator shown in FIG. 1 according to the present invention.

FIG. 4 is a circuit diagram of an embodiment of the first frequency differentiator 20 shown in FIG. 1. The first frequency differentiator 20 includes first, second, third and fourth delays 42, 44, 46 and 48, multipliers 50 and 52 and a subtractor 54.

In FIG. 4, the first delay 42 delays the signal $I_i''$ input through an input port IN2 from the first de-emphasizer 18 and outputs the delayed result $U_2$ to the second delay 44. The second delay 44 delays the output of the first delay 42 and outputs the delayed result $U_1$ to the multiplier 50.

Similarly, the third delay 46 delays the signal $Q_i''$ input through an input port IN3 from the first de-emphasizer 18 and outputs the delayed result $V_2$ to the fourth delay 48. The fourth delay 48 delays the output of the third delay 46 and outputs the delayed result $V_1$ to the multiplier 52.

Here, the multiplier 50 multiplies the output $U_1$ of the second delay 44 by the output $V_2$ of the third delay 46, and outputs the product to the subtractor 54. The multiplier 52 multiplies the output $U_2$ of the first delay 42 by the output $V_1$ of the fourth delay 48 and outputs the product to the subtractor 54. The subtractor 54 subtracts the product $U_1*V_2$ of the multiplier 50 from the product $V_1*U_2$ of the multiplier 52, and outputs the subtraction result as the frequency-demodulated digital signal [M(i+1)], i.e., Z Each of the first, second, third and fourth delays 42, 44, 46 and 48 may be implemented, for example, by a D flip-flop which latches data in response to the sampling clock signal $CK_S$.

Next, the first gain corrector 22 of FIG. 1 adjusts the gain of the frequency-demodulated digital signal $[B^2 k_f M(i)]$ and outputs the gain-adjusted message signal [M(i)] via an output port OUT.

Figure 5:
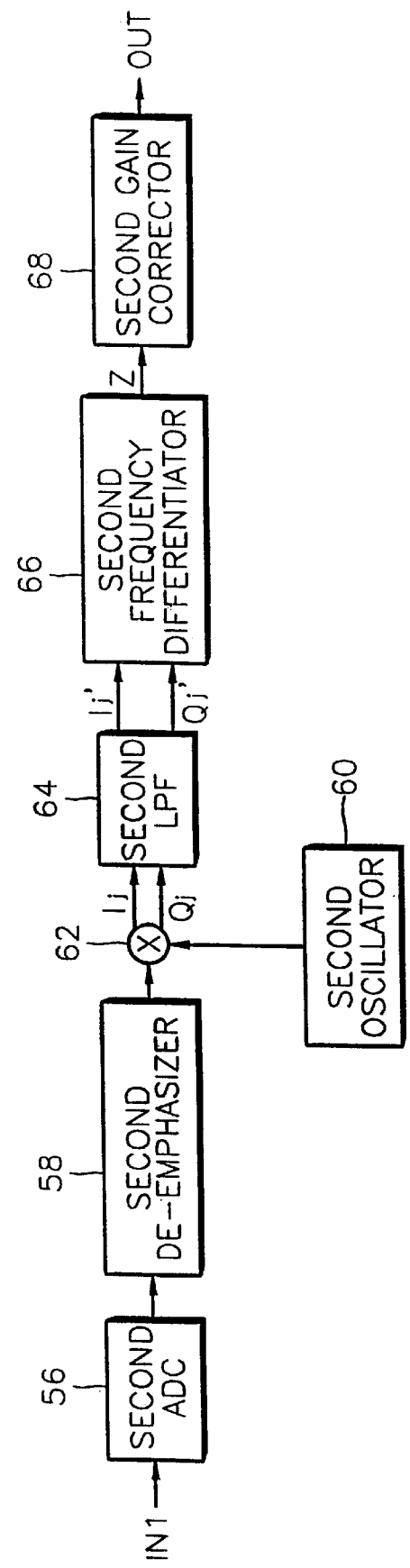
FIG. 5 is a block diagram of a frequency demodulation apparatus according to another embodiment of the present invention.

FIG. 5 is a block diagram of a frequency demodulation apparatus according to another embodiment of the present invention. The frequency demodulation apparatus includes a second ADC 56, a second de-emphasizer 58, a second oscillator 60, a multiplier 62, a second LPF 64, a second frequency differentiator 66 and a second gain corrector 68.

Figure 6:
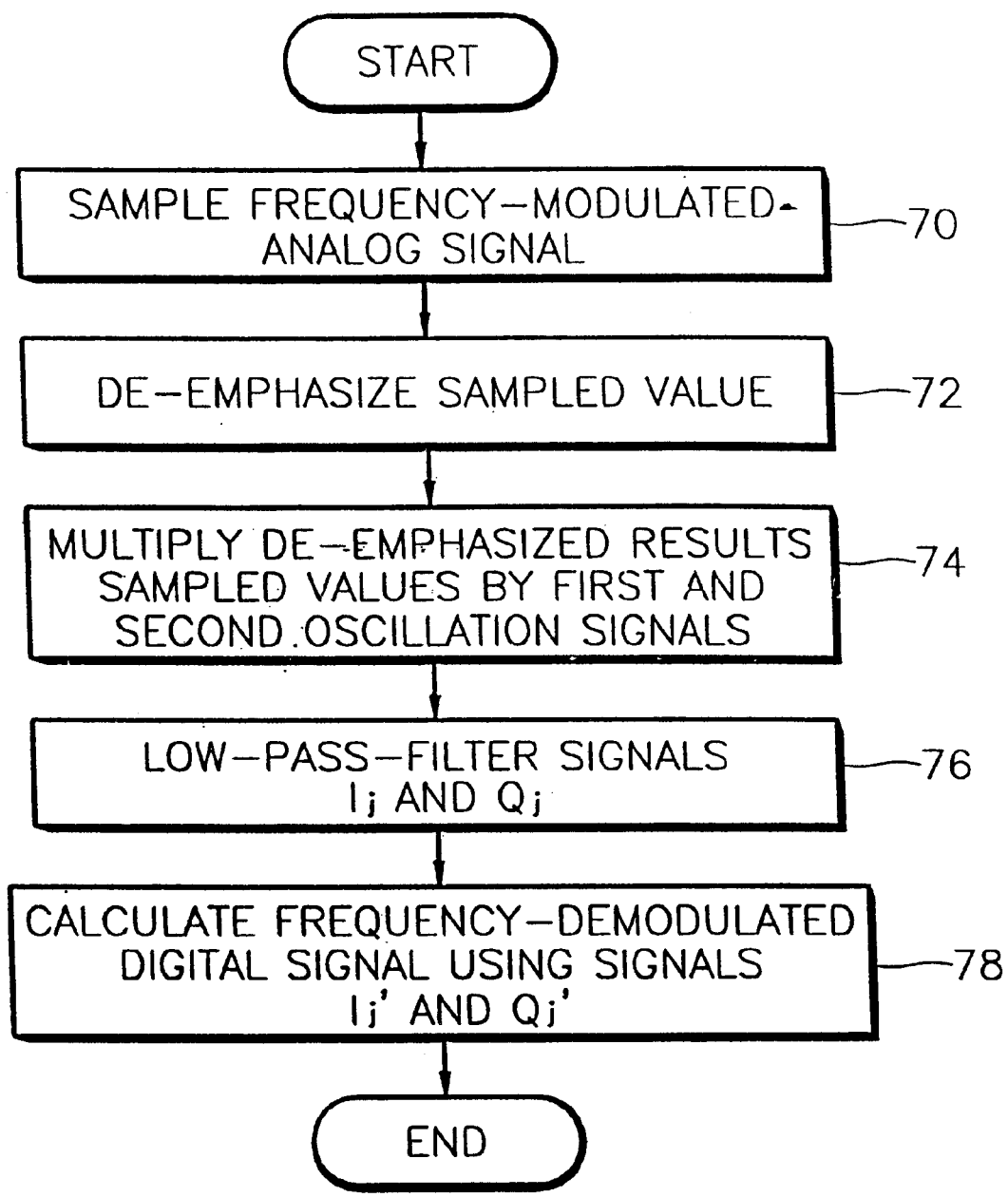
FIG. 6 is a flowchart illustrating a frequency demodulation method performed in the apparatus shown in FIG. 5 according to the present invention.

FIG. 6 is a flowchart illustrating a frequency demodulation method executed by the apparatus of FIG. 5, in which the digital signal converted from the frequency-modulated analog signal is frequency-demodulated using an arcsin approximation (steps 70 through 78).

The frequency modulation apparatus of FIG. 5 has the same structure and function as that of FIG. 1 except for the arrangement of the second de-emphasizer 58, and performs the same operation as that of FIG. 1. That is, while the first de-emphasizer 18 of FIG. 1 is arranged between the first LPF 16 and the first frequency differentiator 20, the second de-emphasizer 58 of FIG. 5 is placed between the second ADC 56 and the multiplier 62. In FIG. 5, the second ADC 56, the second oscillator 60, the second LPF 64 and the second gain corrector 68 correspond to the first ADC 10, the first oscillator 12, the first LPF 16 and the first gain corrector 22 of FIG. 1, respectively. Thus, step 70 of FIG. 6 corresponds to step 30 of FIG. 2.

Following step 70, the second de-emphasizer 58 of FIG. 5 de-emphasizes high-frequency components of the sampled valued $S_i$ output from the second ADC 56, and outputs the de-emphasized result to the multiplier 62 (step 72). Then, the multiplier 62 multiplies by first and second oscillation signals the de-emphasized result output from the second de-emphasizer 58, instead of the sampled value $S_i$, and outputs the products, signals $I_j$ and $Q_j$ ($0 \leq j \leq n$) to the second LPF 64 (step 74). Here, if in Equation (4), the subscript i is replaced by the subscript j and the amplitude [A(j)] is replaced by the normalized value B expressed in the Equation (7), the signals $I_j$ and $Q_j$ are actually the same as $I_i$ and $Q_i$ of Equation (4).

Following step 74, the products $I_j$ and $Q_j$ output from the multiplier 62 are low-pass-filtered in the second LPF 64 (step 76). Then, the second frequency differentiator 66 differentiates the signals $I_j'$ and $Q_j'$, instead of the signals $I_i''$ and $Q_i''$ as in the FIG. 1 embodiment described above, using the above-explained arcsin approximation, and outputs the result of differentiation, that is, the frequency-demodulated digital signal $[B^2 k_f M(j)]$, to the second gain corrector 68 (step 78). That is, the second frequency differentiator 66 performs the same operation as in the first frequency differentiator 20 of FIG. 1, except that the signals input to the first and second frequency differentiators 20 and 66 are different.

Hereinafter, the structure and operation of a frequency modulation apparatus for SECAM chroma demodulation, corresponding to the frequency modulation apparatus of FIGS. 1 or 5, which demodulates color difference signals transmitted in the SECAM fashion, and a frequency demodulation method therefor will be described.

SECAM is a video broadcast standard developed in France, in which two color difference signals $D_b$ and $D_r$ are alternately transmitted through even and odd lines, respectively, so as to prevent crosstalk between the chroma signals. That is, unlike the NTSC (National Television System Committee) and PAL (Phase Alternation by Line), the red-yellow R-Y component ($D_r$) loaded onto either an odd or an even line, and the blue-yellow B-Y component ($D_b$) loaded onto the following line having $D_r$ are transmitted to the receiving part. Here, a luminance component is included in every line in the transmission. In the SECAM fashion, frequency modulation is used for the transmission of the color difference signals, and the two color difference signals each have an independent sub-carrier wave.

Assuming that the frequency-modulated analog signal [X(t)] of the Equation (1) is an analog CVBS (Composite Video Baseband Signal) with a color bust signal, the message signal [M(i)] is a first or second color difference signal $D_b(i)$ or $D_r(i)$, and $f_o$ is the sub-carrier frequency $f_{ob}$ or $f_{or}$ of an analog CVBS having the first or second color difference signal $D_b(i)$ or $D_r(i)$, the above description with reference to FIG. 1 or 5 can be applied to a frequency demodulation apparatus for SECAM chroma demodulation. Here, in a color burst interval where the color burst signal exists, the amplitude [A(t)] of the CVBS becomes a constant and the first or second color difference signal $D_b(i)$ or $D_r(i)$ does not exist. Also, in a video active interval where the color burst signal does not exist, the amplitude [A(t)] becomes a function of time. Here, $f_{ob}$ and $f_{or}$ may be 4.25 MHz($\pm$2 kHz) and 4.4 MHz ($\pm$2 kHz), respectively.

Figure 7:
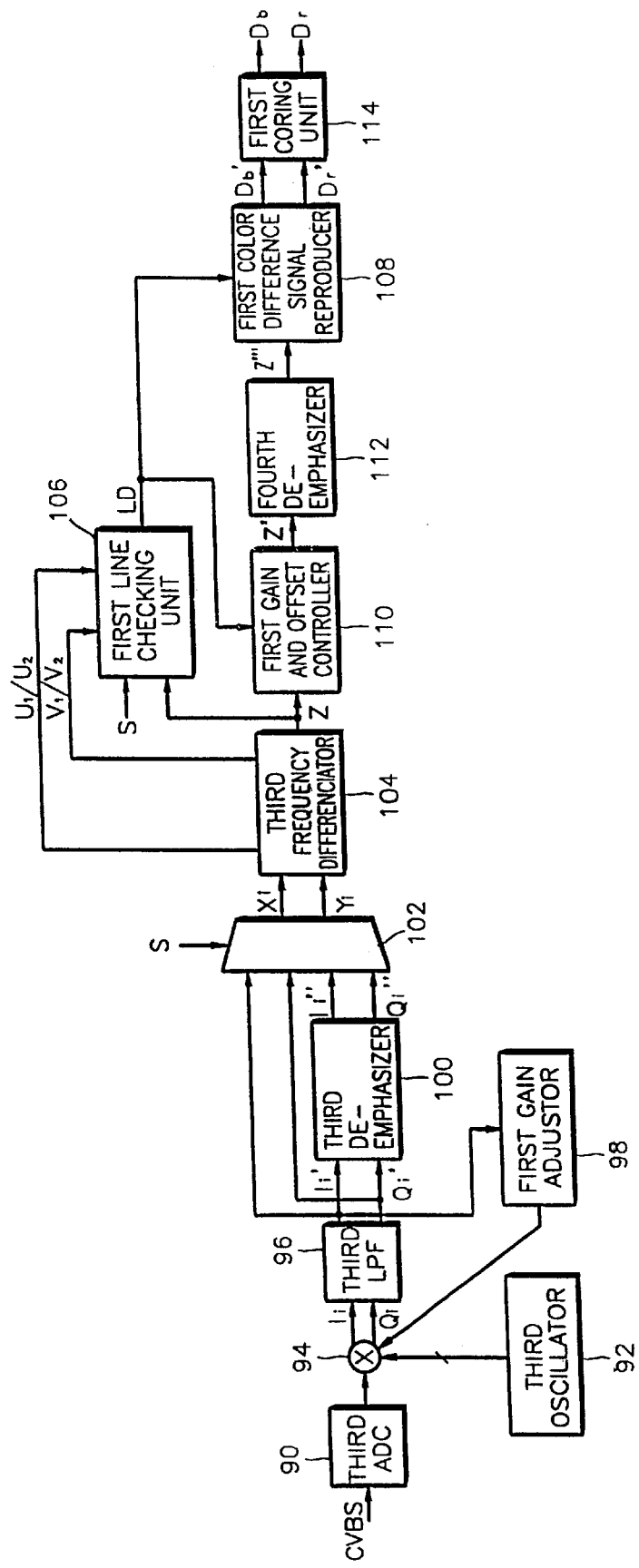
FIG. 7 is a circuit diagram of a frequency demodulation apparatus for SECAM (SEquential Couleur Avec Memoire or SEquential Color with Memory) chroma demodulation according to a first embodiment of the present invention.

FIG. 7 is a circuit diagram of a frequency demodulation apparatus for SECAM chroma demodulation according to a first embodiment of the present invention. The frequency demodulation apparatus includes a third ADC 90, a third oscillator 92, a multiplier 94, a third LPF 96, a first gain adjustor 98, a third de-emphasizer 100, a multiplexer 102, a third frequency differentiator 104, a first line checking unit 106, a first color difference signal reproducer 108, a first gain and offset controller 110, a fourth de-emphasizer 112 and a first coring unit 114.

Figure 8:
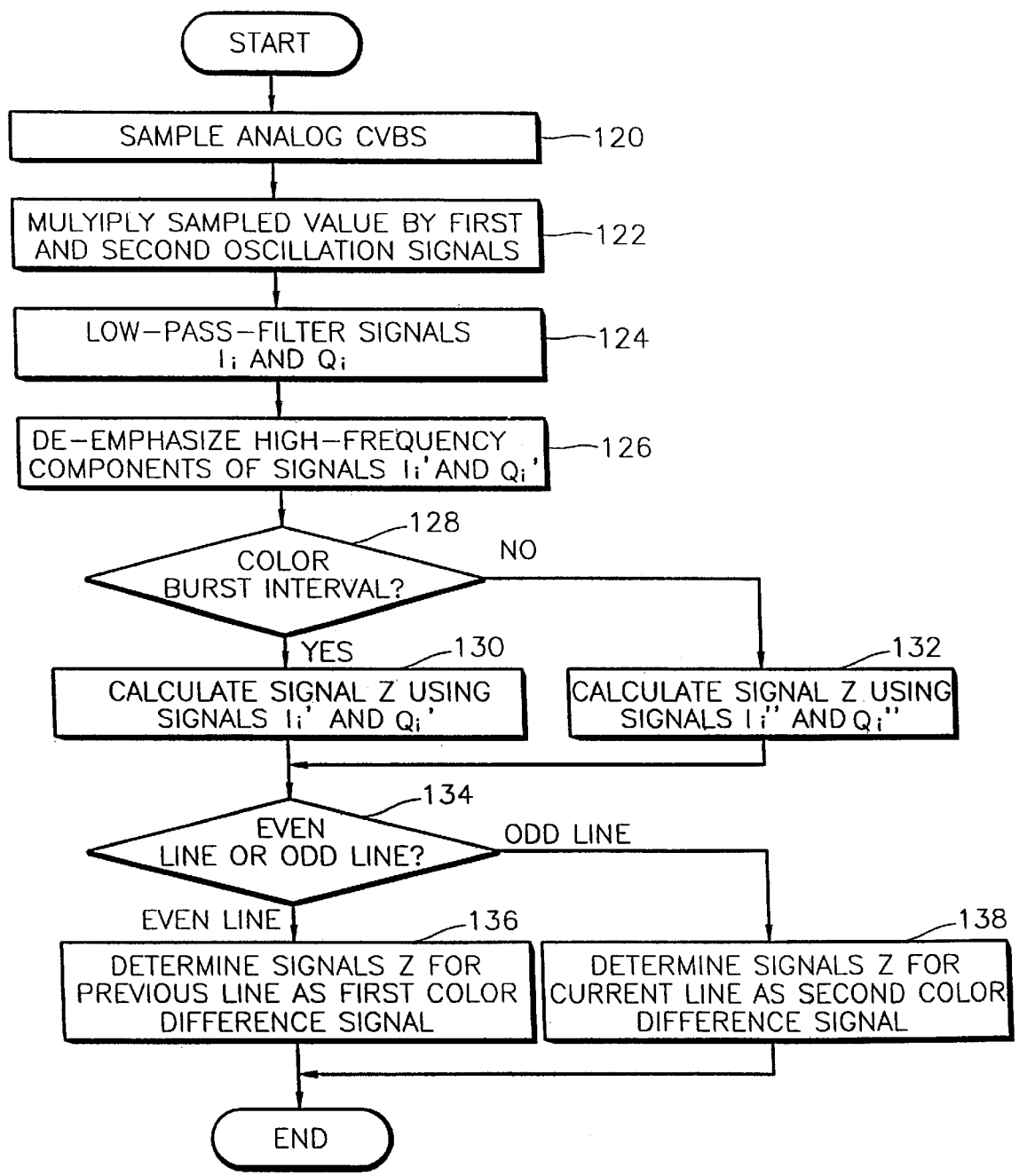
FIG. 8 is a flowchart illustrating a frequency demodulation method for the SECAM chroma demodulation performed in the apparatus of FIG. 7 according to the present invention.

FIG. 8 is a flowchart illustrating a frequency demodulation method for a SECAM chroma demodulation according to the present invention, performed in the apparatus of FIG. 7, in which a digital CVBS converted from an analog CVBS is demodulated into a signal Z (steps 120 through 132) and the signal Z is divided in lines to determine first and second color difference signals (steps 134 through 138).

The third ADC 90 of FIG. 7 receives an analog signal CVBS with a frequency-modulated first or second color difference signal $D_b(i)$ or $D_r(i)$, samples the input analog CVBS in response to a sampling clock signal $CK_S$, in order to convert the analog signal into a digital signal, and outputs digital sampled values $S_0 \sim S_n$ to the multiplier 94 (step 120).

Then, the multiplier 94 multiplies the first and second oscillation signals output from the third oscillator 92 by the sampled values $S_i$ ($0 \leq i \leq n$) output from the third ADC 90, respectively, and outputs the products $I_i$ and $Q_i$ to the third LPF 96 (step 122). To this end, the third oscillator 92 outputs the first and second oscillation signals expressed by Equation (3) having the free running frequency $f_{SC}$ as in the same manner as in the first oscillator 12 of FIG. 1. Here, the frequency of the above-mentioned sampling clock signal $CK_S$ may be 13.5 MHz and the free running frequency $f_{SC}$ may be 4.33 MHz, wherein the frequency of the sampling clock signal $CK_S$ and the free running frequency $f_{SC}$ must satisfy the Nyquist rate.

Following step 122, the third LPF 96 low-pass-filters the signals $I_i$ and $Q_i$ and outputs the low-pass-filtered signals $I_i'$ and $Q_i'$ to the third de-emphasizer 100 (step 124).

Here, the first gain adjustor 98 may be further provided between the third LPF 96 and the multiplier 94, checks whether the amplitude of the signal $I_i'$ output from the third LPF 96 maintains a predetermined value during the color burst interval, and outputs to the multiplier 94 a gain determined in response to the check result. Thus, the multiplier 94 multiplies the sampled values by the gain determined in the first gain adjustor 98, and then by the respective first and second oscillation signals, to output signals $I_i$ and $Q_i$. That is, because there is a high probability that the level of the first or second color difference signals is low if the level of the color burst signal is less than a predetermined level, it is necessary for the first gain adjustor 98 to keep the level of the low-pass-filtered result constant.

Following step 124, the third de-emphasizer 100 de-emphasizes high-frequency components of the signals $I_i'$ and $Q_i'$ and outputs the de-emphasized signals $I_i''$ and $Q_i''$ to the multiplexer 102 (step 126). When the first and the second color different signals are transmitted using the SECAM fashion to the receiving part from a transmitting part, high-frequency components of the color difference signals are very susceptible to noise, so the signal-to-noise distortion ratio (SNDR) may be lowered. Thus, at the transmitting part pre-emphasis is performed to increase the amplitude of the high-frequency component. Also, at the receiving part the high-frequency components of the signals $I_i'$ and $Q_i'$ are de-emphasized using the third de-emphasizer 100 as mentioned above when the color difference signals are frequency-demodulated. The third de-emphasizer may comprise, for example, a cloche filter or a bell filter.

Following step 126, it is determined whether the current interval is the color burst interval (step 128). If so, the third frequency differentiator 104 obtains a signal Z using the signals $I_i'$ and $Q_i'$ output from the third LPF 96 (step 130). Otherwise, the third frequency differentiator 104 obtains the signal Z using the signals $I_i''$ and $Q_i''$ output from the third de-emphasizer 100 (step 132). To this end, a selection signal S is generated such that the multiplexer 102 selects the outputs $I_i'$ and $Q_i'$ of the third LPF 96 during the color burst interval and the outputs $I_i''$ and $Q_i''$ of the third de-emphasizer 100 during the video active interval. For example, the selection signal S can be generated in a controller (not shown) depending on whether a color burst signal is present, for example, such that it maintains a high level during the color burst interval and a low level during the video active interval.

The third frequency differentiator 104 performs the same operation as in the first frequency differentiator 20 of FIG. 1 or the second frequency differentiator 66 of FIG. 5. That is, the Equation (8) can be expressed as Equation (10).

$$X_i * Y_{i+1} - X_{i+1} * Y_i = B^2 * \{\sin\beta \cdot \cos\alpha - \sin\alpha \cdot \cos\beta\} \quad (10)$$
$$= B^2 * \sin(\beta - \alpha)$$
$$= B^2 * \sin[k_f D_r(i+1)] \text{ or}$$
$$B^2 * \sin[k_f D_b(i+1)]$$

In Equation (10), $X_i$ and $Y_i$ correspond to the signals $I_i''$ and $Q_i''$ of Equation (8), $\alpha$ corresponds to $$k_f \sum_{p=0}^{i} D_r(p) \text{ or } k_f \sum_{p=0}^{i} D_b(p),$$

and $\beta$ corresponds to $$k_f \sum_{p=0}^{i+1} D_r(p) \text{ or } k_f \sum_{p=0}^{i+1} D_b(p).$$

As described above, $\sin(\beta-\alpha)$ expressed in the Equation (10) approximates to $\beta-\alpha$ using the aresin approximation. Actually, the maximum width of the frequency deviation of the first or second color difference signal information integrated based on the frequency of the sampling clock signal $CK_S$ used in the third ADC 90 is less than 500 kHz, so that $\beta-\alpha$ becomes a maximum of 13.3° (13.5 MHz:500kHz= 360°:13.3°). Because the interval from 0~13.3° in the sine function is nearly linear, it is understood that the arcsin approximation according to the present invention can be applied to the actual circumstances. For example, if the third de-emphasizer 100 normalizes the amplitude [A(nT)] to B, $B^2 k_f D_r(i+1)$ or $B^2 k_f D_b(i+1)$ approximate $X_i * Y_{i+1} - X_{i+1} * Y_i$. Thus, the third frequency differentiator 104 may be implemented by the circuit of FIG. 4, and the signal Z corresponds to $B^{2k}_f D_r(i+1)$ or $B^2 k_f D_b(i+1)$.

After the step 130 or 132, the first line checking unit 106 decides whether the current 1 5 line is an even line or an odd line (step 134). If the current line is an even line, the signal Z on the previous line is decided as a frequency-demodulated first color difference signal [$D_b'$] (step 136).

However, if the current line is an odd line, the signal Z on the current line is decided as a frequency-demodulated second color difference signal [$D_r'$] (step 138). To this end, the first line checking unit 106 checks whether the current line is an odd line or an even line in response to the signal Z, the selection signal S and delayed results $U_1/U_2$ and $V_1/V_2$, and outputs the check result LD to the first color difference signal reproducer 108. The first color difference signal reproducer 108 extracts the signal Z on the previous line and the signal Z on the current line as the frequency-demodulated first and second color difference signals [$D_b'$] and [$D_r'$], respectively, in response to the logic level of the check result LD, and outputs the first and second color difference signals [$D_b$] and [$D_r'$] to the first coring unit 114.

When Equation (5) is approximated to Equation (6), $f_{SC}-f_{ob}$ or $f_{SC}-f_{or}$ is neglected. However, $f_{SC}-f_{ob}$ or $f_{SC}-f_{or}$ should not be neglected in the actual situation. If $f_{SC}-f_{ob}$ or $f_{SC}-f_{or}$ is neglected, the demodulated color difference signals may have an offset. Thus, the first gain and offset controller 110 may be used to compensate for the offset caused by the above-mentioned approximation, so as to adjust and to compensate for the gain and offset of the signal Z in response to the check result LD, and outputs the gain-adjusted and offset-compensated result to the fourth de-emphasizer 112. In addition, the first gain and offset controller 110 operates as the first gain corrector 22 of FIG. 1 or the second gain corrector 68 of FIG. 5.

In the SECAM fashion, at the transmitting part from which color difference signals are transmitted, pre-emphasis is performed on respective low-frequency components of the first and second color different signals in order to improve noise immunity. Thus, the frequency demodulation apparatus of the receiving part includes the fourth de-emphasizer 112 as shown in FIG. 7. The fourth de-emphasizer 112 de-emphasizes the low-frequency component of the gain- and offset-controlled signal output from the first gain and offset controller 110, and outputs the de-emphasized signal Z''' to the first color difference signal reproducer 108.

In a preferred embodiment, the first coring unit 114 is provided. The first coring unit 104 detects as a noise a small change in the amplitudes of the frequency-demodulated first and second color difference signals [$D_b'$] and [$D_r'$] separated in the first color difference signal reproducer 108, changes the level of the difference signals to a predetermined level, and outputs final first and second color difference signals $D_b$ and $D_r$ having the changed levels.

Figure 9:
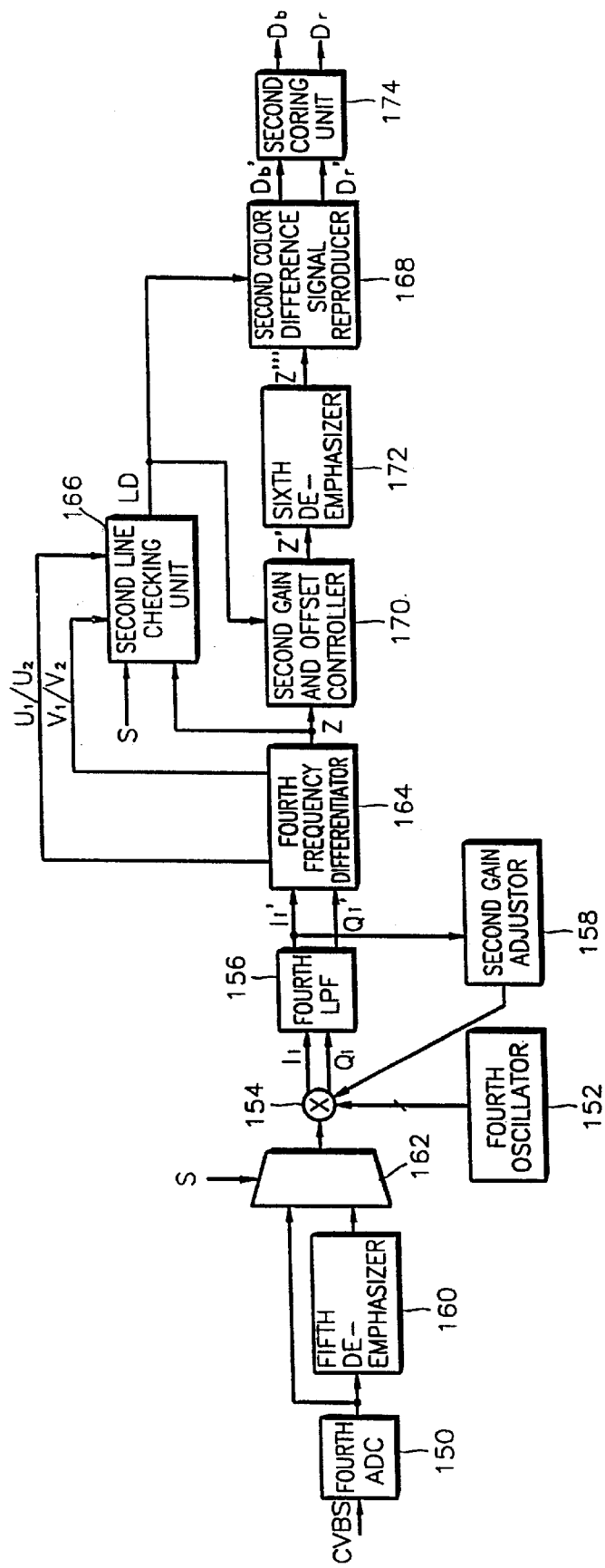
FIG. 9 is a circuit diagram of a frequency demodulation apparatus for SECAM chroma demodulation according to a second embodiment of the present invention.

FIG. 9 is a circuit diagram of a frequency demodulation apparatus for the SECAM chroma demodulation according to a second embodiment of the present invention. The frequency demodulation apparatus of FIG. 9 comprises a fourth ADC 150, a fourth oscillator 152, a multiplier 154, a fourth LPF 156, a second gain adjustor 158, a fifth de-emphasizer 160, a multiplexer 162, a fourth frequency differentiator 164, a second line checking unit 166, a second color difference signal reproducer 168, a second gain and offset controller 170, a sixth de-emphasizer 172 and a second coring unit 174.

Figure 10:
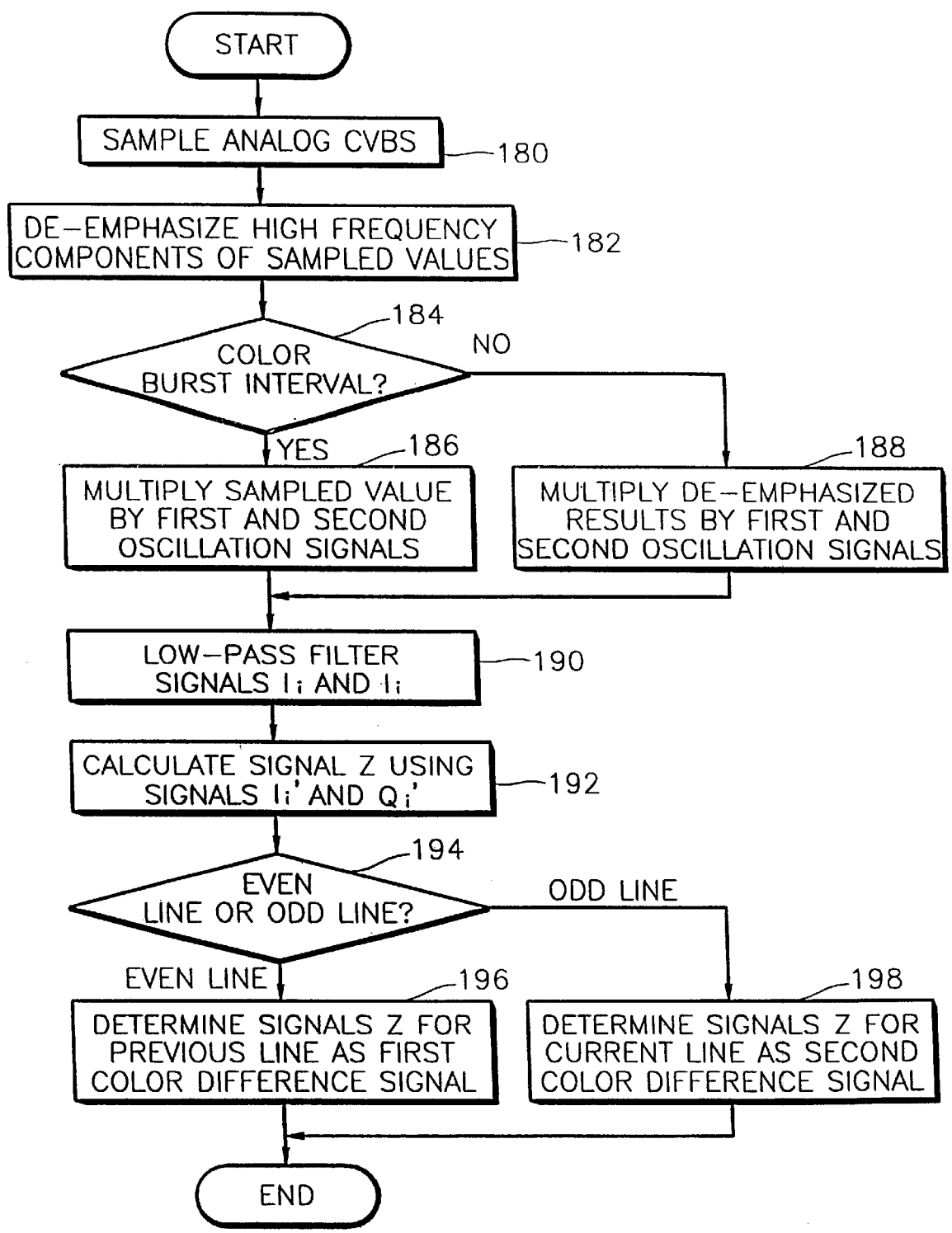
FIG. 10 is a flowchart illustrating a frequency demodulation method for the SECAM chroma demodulation performed in the apparatus of FIG. 9 according to the present invention.

FIG. 10 is a flowchart illustrating a frequency modulation method for SECAM chroma demodulation according to the present invention, performed in the apparatus of FIG. 9, in which a digital CVBS converted from an analog CVBS is demodulated to extract a signal Z (steps 180 through 192) and the obtained signal Z is divided across lines to determine color difference signals (steps 194 through 198).

The frequency modulation apparatus of FIG. 9 has the same structure as that of FIG. 7 except that the fifth de-emphasizer 160 and the multiplexer 162 are arranged between the fourth ADC 150 and the multiplier 154, and performs the same operation as that of FIG. 7. That is, the fourth ADC 150, the fourth oscillator 152, the second gain adjustor 158, the fourth frequency differentiator 164, the second line checking unit 166, the second color difference signal reproducer 168, the second gain and offset controller 170, the sixth de-emphasizer 172 and the second coring unit 174 of FIG. 9 correspond to the third ADC 90, the third oscillator 92, the first gain adjustor 98, the third frequency differentiator 104, the first line checking unit 106, the first color difference signal reproducer 108, the first gain and offset controller 110, the fourth de-emphasizer 112 and the first coring unit 114 of FIG. 7, respectively, and perform the same operations. Thus, step 180, and steps 194 through 198 correspond to step 120, and steps 134 through 138, respectively.

Following step 180, the fifth de-emphasizer 160 de-emphasizes the high-frequency component of the sampled value output from the fourth ADC 150, and outputs the de-emphasized result to the multiplexer 162 (step 182). Next it is determined if the current interval is a color burst interval (step 184). If so, the multiplier 154 multiplies the sampled value by the first and second oscillation signals respectively (step 186). Otherwise, the multiplier 154 multiplies the de-emphasized result output from the fifth de-emphasizer 160 by the first and second oscillation signals respectively, in a video active interval (step 188). To this end, a selection signal S is generated such that the multiplexer 162 selects the sampled value output from the fourth ADC 150 in the color burst interval and the output of the fifth de-emphasizer 160 in the video active interval.

Following step 186 or 188, the fourth LPF 156 low-pass-filters the products $I_i$ and $Q_i$ of the multiplier 154 and outputs the filtered results $I_i'$ and $Q_i'$ to the fourth frequency differentiator 164 (step 190). Following step 190, the fourth frequency differentiator 164 which performs the same operation as by the third frequency differentiator 104 of FIG. 7 differentiates the filtered result output from the fourth LPF 156 using the above-described arcsin approximation and outputs the differentiated result as a signal Z (step 192).

Figure 11:
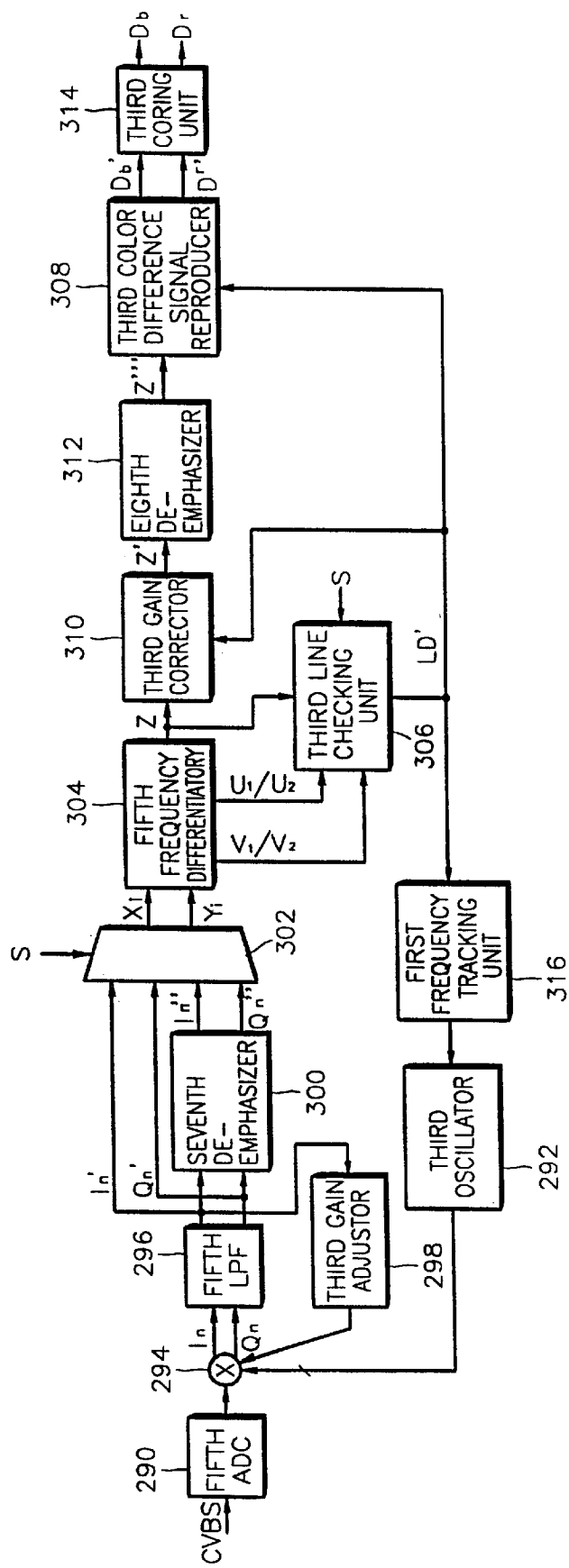
FIG. 11 is a circuit diagram of a frequency demodulation apparatus for SECAM chroma demodulation according to a third embodiment of the present invention.

FIG. 11 is a circuit diagram of a frequency demodulation apparatus for SECAM chroma demodulation according to a third embodiment of the present invention. The frequency demodulation apparatus of FIG. 11 comprises a fifth ADC 290, a fifth oscillator 292, a multiplier 294, a fifth LPF 296, a third gain adjustor 298, a seventh de-emphasizer 300, a multiplexer 302, a fifth frequency differentiator 304, a third line checking unit 306, a third color difference signal reproducer 308, a third gain corrector 310, an eighth de-emphasizer 312, a third coring unit 314 and a first frequency tracking unit 316.

The structure and operation of the frequency demodulation apparatus of FIG. 11 are the same as those of the frequency demodulation apparatus of FIG. 7, except that the first frequency tracking unit 316 is further provided so as to control the oscillation frequency of the fifth oscillator 292, the third gain corrector 310 is provided instead of the first gain and offset controller 110 of FIG. 7, and the line checking method of the third line checking unit 306 is different from that of the first line checking unit 106 of FIG. 7. That is, the fifth ADC 290, the multiplier 294, the fifth LPF 296, the third gain adjustor 298, the seventh de-emphasizer 300, the multiplexer 302, the fifth frequency differentiator 304, the third color difference signal reproducer 308, the eighth de-emphasizer 312 and the third coring unit 314 of FIG. 11 correspond to the third ADC 90, the multiplier 94, the third LPF 96, the first gain adjustor 98, the third de-emphasizer 100, the multiplexer 102, the third frequency differentiator 104, the first color difference signal reproducer 108, the fourth de-emphasizer 112 and the first coring unit 114 of FIG. 7, respectively, and perform the same operations. Thus, the frequency demodulation method illustrated with reference to FIG. 8 can be applied to the apparatus of FIG. 11.

As described above, in the frequency demodulation apparatus of FIG. 11, the first and second oscillation signals do not oscillate independently, unlike the apparatus of FIG. 7. That is, the first frequency tracking unit 316 tracks the sub-carrier frequency $f_{ob}$ or $f_{or}$ of the analog CVBS in response to the check result LD' output from the third line checking unit 306, and outputs the track results to the fifth oscillator 292. Here, the fifth oscillator 292 does not have its own free running frequency and outputs the first and second oscillation signals to the multiplier 294, the frequencies of which are determined in response to the result tracked by the first frequency tracking unit 316.

Also, unlike the first gain and offset controller 110 of FIG. 7 which controls both the gain and the offset of the signal Z, the third gain corrector 310 of FIG. 11 adjusts only the gain of the signal Z. That is, the third gain corrector 310 adjusts the gain of the signal Z in response to the check result LD', and outputs the adjust result to the third color difference signal reproducer 308 via the eighth de-emphasizer 312. Here, the third gain corrector 310 acts as the first gain corrector 22 of FIG. 1 or the second gain corrector 68 of FIG. 5.

Here, the third line checking unit 306 has the same function as that of the first line checking unit 106 of FIG. 7, but its line checking method is different from that of first line checking unit 106. That is, the first or third line checking unit 106 or 306 checks whether the current line is an odd line or even line by using the signal Z selection signal S and the delayed results $U_1/U_2$ and $V_1/V_2$ and outputs the check result LD'. However, the first line checking unit 106 of FIG. 7 and the third line checking unit 306 of FIG. 11 compare the frequency of a color burst signal with predetermined frequencies, which will be described below. For example, the predetermined frequency used to check the line in the first line checking unit 106 is 4.33 MHz, but that for the third line checking unit 306 is 4.25 MHz.

Figure 12:
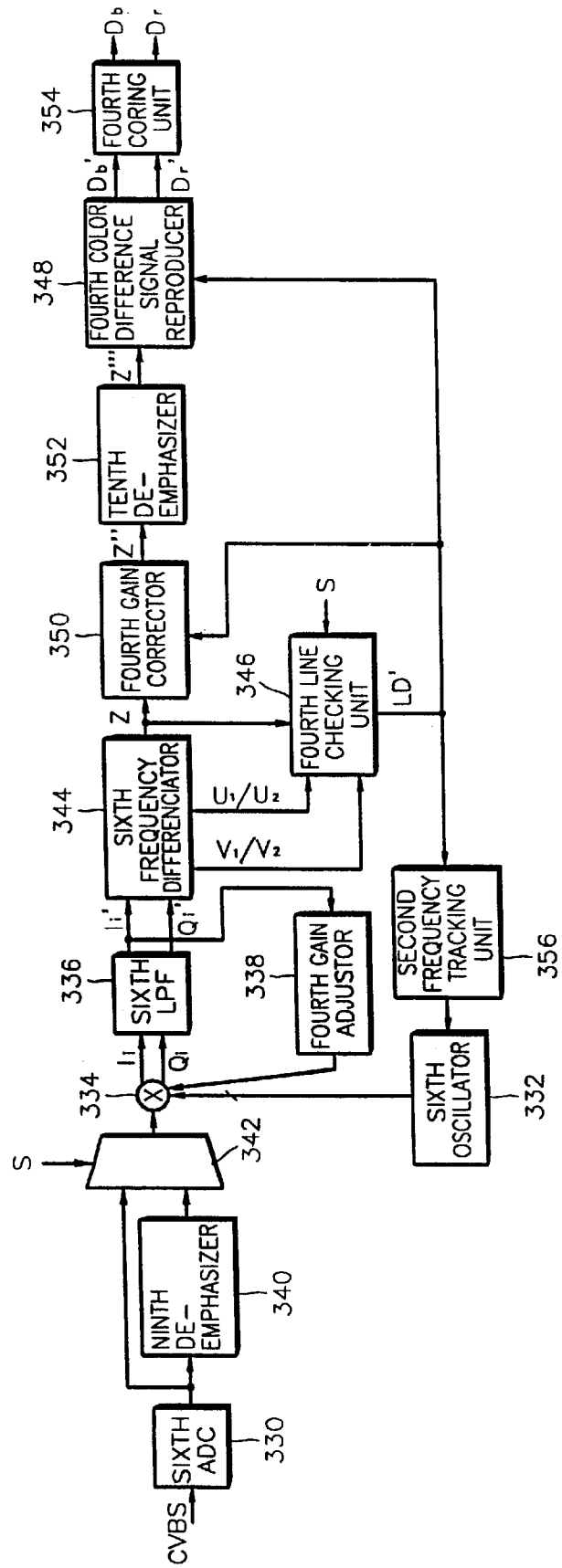
FIG. 12 is a circuit diagram of a frequency demodulation apparatus for SECAM chroma demodulation according to a fourth embodiment of the present invention.

FIG. 12 is a block diagram of a frequency demodulation apparatus for SECAM chroma demodulation according to a fourth embodiment of the present invention. The frequency demodulation apparatus of FIG. 12 comprises a sixth ADC 330, a sixth oscillator 332, a multiplier 334, a sixth LPF 336, a fourth gain adjustor 338, a ninth de-emphasizer 340, a multiplexer 342, a sixth frequency differentiator 344, a fourth line checking unit 346, a fourth color difference signal reproducer 348, a fourth gain corrector 350, a tenth de-emphasizer 352, a fourth coring unit 354 and a second frequency tracking unit 356.

The frequency demodulation apparatus of FIG. 12 performs the same operation as that of FIG. 9, except the frequency demodulation apparatus of FIG. 12 further comprises the second frequency tracking unit 356 for controlling the oscillation frequency of the sixth oscillator 332, and the fourth gain corrector 350 is adopted instead of the second gain and offset controller 170, and the line checking method of the fourth line checking unit 346 is different from that of the second line checking unit 166. That is, the sixth ADC 330, the multiplier 334, the sixth LPF 336, the fourth gain adjustor 338, the ninth de-emphasizer 340, the multiplexer 342, the sixth frequency differentiator 344, the fourth color difference signal reproducer 348, the tenth de-emphasizer 352 and the fourth coring unit 354 shown in FIG. 12 correspond to the fourth ADC 150, the multiplier 154, the fourth LPF 156, the second gain adjustor 158, the fifth de-emphasizer 160, the multiplexer 162, the fourth frequency differentiator 164, the second color difference signal reproducer 168, the sixth de-emphasizer 172 and the second coring unit 174 shown in FIG. 9, respectively, and perform the same operations.

Also, unlike the frequency demodulation apparatus of FIG. 11 in which the seventh de-emphasizer 300 and the multiplexer 302 are arranged between the fifth LPF 290 and the fifth frequency differentiator 304, the ninth de-emphasizer 340 and the multiplexer 342 are arranged between the sixth ADC 330 and the multiplier 334 in the frequency demodulation apparatus of FIG. 12. Except for these distinctions, the frequency reproduction apparatus of FIG. 12 performs substantially the same operation as the frequency demodulation apparatus of FIG. 11. That is, the sixth oscillator 332, the second frequency tracking unit 356, the fourth gain corrector 350 and the fourth line checking unit 346 of FIG. 12 correspond to the fifth oscillator 292, the first frequency tracking unit 316, the third gain corrector 310 and the third line detecting unit 306 of FIG. 11, respectively. Thus, the frequency demodulation. method illustrated in FIG. 10 can be applied to the frequency demodulation apparatus of FIG. 12.

Hereinafter, the structure and operation of the first, second, third or fourth line checking unit 106, 166, 306 or 346 according to an embodiment of the present invention will be described.

Figure 13:
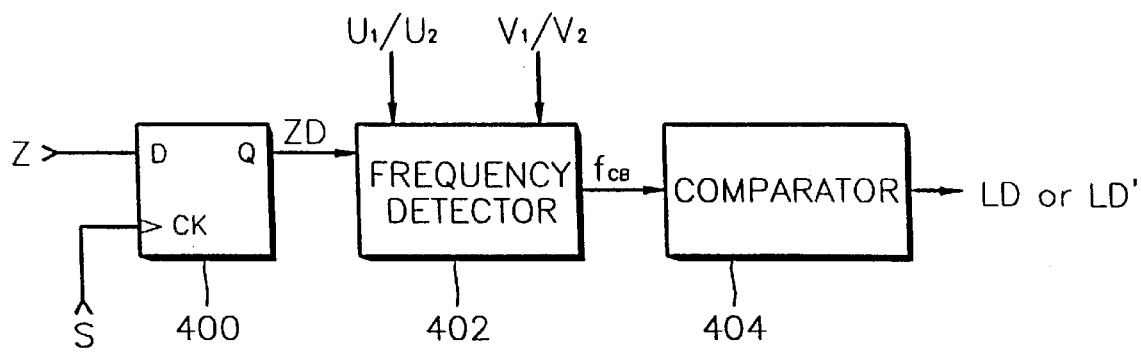
FIG. 13 is a block diagram of an example of the first, second, third or fourth line checking unit of FIG. 7, 9, 11 or 12 according to an embodiment of the present invention.

FIG. 13 is a block diagram showing an example of the first, second, third or fourth line checking unit 106, 166, 306 or 346. The line checking unit of FIG. 13 comprises a flip-flop 400, a frequency detector 402 and a comparator 404.

In the line checking unit of FIG. 13, the flip-flop 400, a latch, receives the signal Z through a data input port D and a selection signal S through a clock port CK, and outputs the latched Z signal ZD through a positive output port Q to the frequency detector 402. Here, the frequency detector 402 detects the frequency of a color burst signal using the delayed result $U_1/U_2$ or $V_1/V_2$ input from the frequency differentiator of FIG. 4 and the latched Z signal ZD, and outputs a detected frequency $f_{CB}$ to the comparator 404. The structure of the frequency detector 402 of FIG. 13 and its operation will now be described in detail with reference to FIG. 14.

Figure 14:
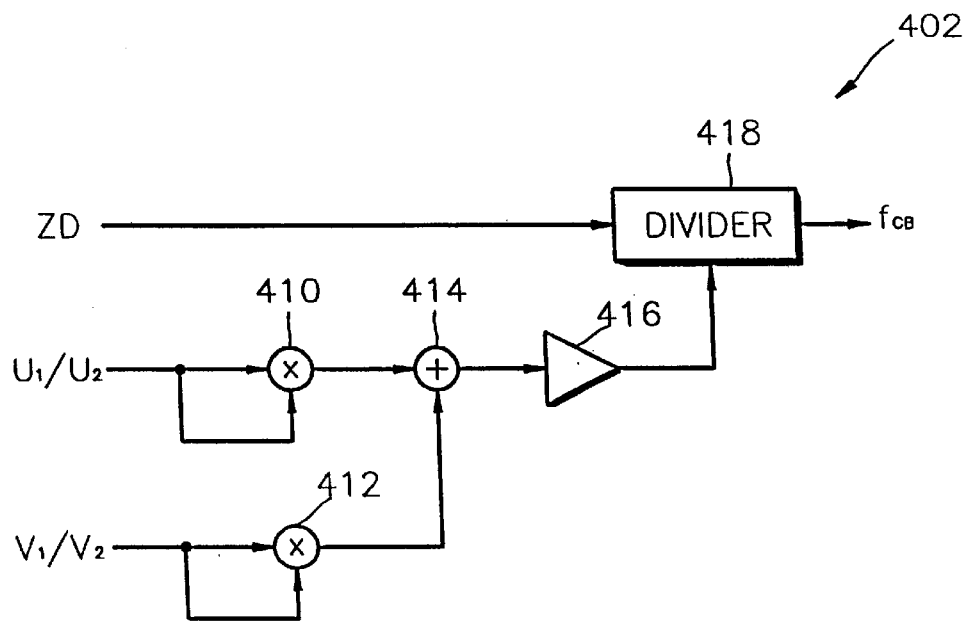
FIG. 14 is a circuit diagram of an example of the frequency detector of FIG. 13 according to an embodiment of the present invention.

FIG. 14 is a circuit diagram showing an example of the frequency detector 402 shown in FIG. 13. The frequency detector of FIG. 14 comprises first and second square calculators 410 and 412, an adder 414, an amplifier 416 and a divider 418.

The first square calculator 410 of FIG. 14 squares the signal $U_1$ output from the second delay 44 (see FIG. 4) and outputs the square result $U_1^2$ to the adder 414. The second square calculator 412 squares the signal $V_1$ output from the fourth delay 48 (see FIG. 4) and outputs the square result $V_1^2$ to the adder 414. The adder 414 adds the output of the second square calculator 412 to the output of the first square calculator 410, and outputs the addition result $U_1^2+V_1^2$ to the amplifier 416. The amplifier 416 amplifies the addition result of the adder 414 and outputs the amplified result to the divider 418. Here, the divider 418 divides the latched Z signal ZD in the flip-flop 400 by the output of the amplifier 416, and outputs the divided result as the frequency $f_{CB}$ of the color burst signal. Here, it can be understood that the latched Z signal ZD corresponds to $X_i^*Y_{i+1}-X_{i+1}^*Y_i$ in Equation (10) and the result amplified by the amplifier 416 corresponds to $B^2k_f$ or $$\left[\frac{A(iT)}{2}\right]^2 k_f$$

from Equation (6) or (7). That is, the frequency detector 402 detects the frequency of the color burst signal using the arcsin approximation. Also, in the frequency detector 402 of FIG. 14, the first and second square calculators 410 and 412 may square the outputs $U_2$ and $V_2$ of the first and third delays 42 and 46 respectively, instead of the outputs $U_1$ and $V_1$ of the second and fourth delays 44 and 48.

The comparator 404 of FIG. 13 compares the frequency $f_{CB}$ of the color burst signal output from the frequency detector 402 with a predetermined frequency and outputs the comparison result as the check result LD or LD'. For example, the comparator 404 outputs the check result (LD or LD') as a logic "high" if the frequency of the color burst signal is lower than a predetermined frequency, and as a logic "low" if the frequency of the color burst signal is higher than the predetermined frequency. Here, if the line checking unit of FIG. 13 is the first or second line checking unit 106 or 166, the predetermined frequency is 4.33 MHz, that is, the average value of the sub-carrier frequency $f_{ob}$ of the analog CVBS having the first color difference signal, and the sub-carrier frequency $f_{or}$ of the analog CVBS having the second color difference signal. However, if the line checking unit of FIG. 13 is the third or fourth line checking unit 306 or 346, the predetermined frequency may be 4.25 MHz which is the sub-carrier frequency $f_{ob}$ of the analog CVBS having the first color difference signal.

Figure 15:
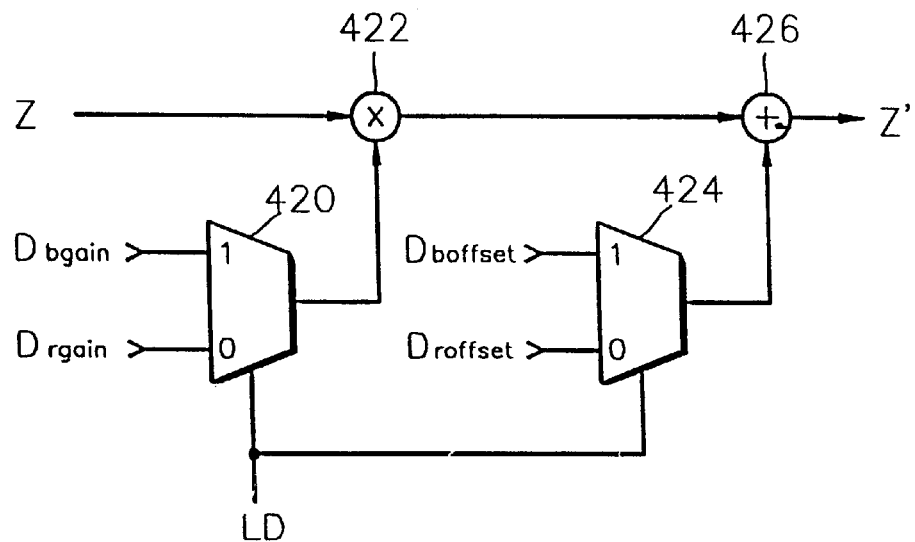
FIG. 15 is a circuit diagram of an embodiment of the first or second gain and offset controller of FIG. 7 or 9, respectively, according to the embodiment of the present invention.

FIG. 15 is a circuit diagram of an example of the first gain and offset controller 110 of FIG. 7 or the second gain and offset controller 170 of FIG. 9 according to the present invention. The first gain and offset controller of FIG. 15 comprises a multiplier 422, an adder 426 and multiplexers 420 and 424.

The multiplexer 420 of FIG. 15 selects one of the first and second gain values $D_{bgain}$ and $D_{rgain}$ for the first and second color difference signals in response to the check result LD from the line checking unit, and outputs the selected gain value to the multiplier 422. The multiplexer 424 selects one of the first and second offset values $D_{boffset}$ and $D_{roffset}$ for the first and second color difference signals in response to the check result LD and outputs the selected result to the adder 426. The multiplier 422 multiplies the signal Z output from the third or fourth frequency differentiator 104 or 164 by the output of the multiplexer 420 and outputs the product to the adder 426. The adder 426 adds the output of the multiplexer 424 to the product of the multiplier 422 and outputs the addition result as the gain-adjusted and offset-compensated Z signal Z' to the fourth or sixth de-emphasizer 112 or 172. Here, the first or second gain and offset controller 110 or 170 of FIG. 15 adjusts the first and second gain values so as to normalize $B^2 k_f$ to 1.

Figure 16:
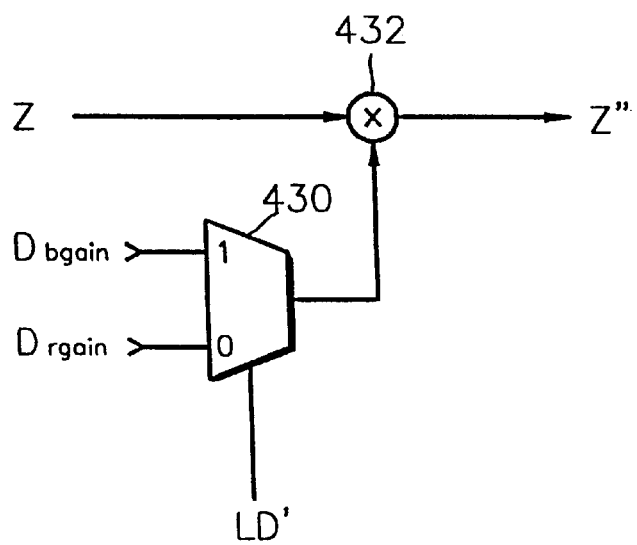
FIG. 16 is a circuit diagram of an example of the third or fourth gain corrector of FIG. 11 or 12 according to the embodiment of the present invention.

FIG. 16 is a circuit diagram of an example of the third gain corrector 310 of FIG. 11 or the fourth gain corrector 350 of FIG. 12. The gain adjustor of FIG. 16 comprises a multiplexer 430 and a multiplier 432.

In FIG. 16, the multiplexer 430 selects one of the first and second gain values $D_{bgain}$ and $D_{rgain}$ for the first and second color difference signals in response to the check result LD' from the line checking unit, and outputs the selected gain value to the multiplier 432. The multiplier 432 multiplies the signal Z output from the fifth or sixth frequency differentiator 304 or 344 by the output of the multiplexer 430, and outputs the product as the gain-adjusted Z signal Z" to the eighth or tenth de-emphasizer 312 or 352.

Here, the third or fourth gain corrector 310 or 350 of FIG. 16 adjusts the gains values $D_{bgain}$ and $D_{rgain}$ so as to normalize $B^2 k_f$ to 1.

Next, the structure and operation of the first, second, third or fourth color difference signal reproducer 108, 168, 308 or 348 according to an embodiment of the present invention will be described.

Figure 17:
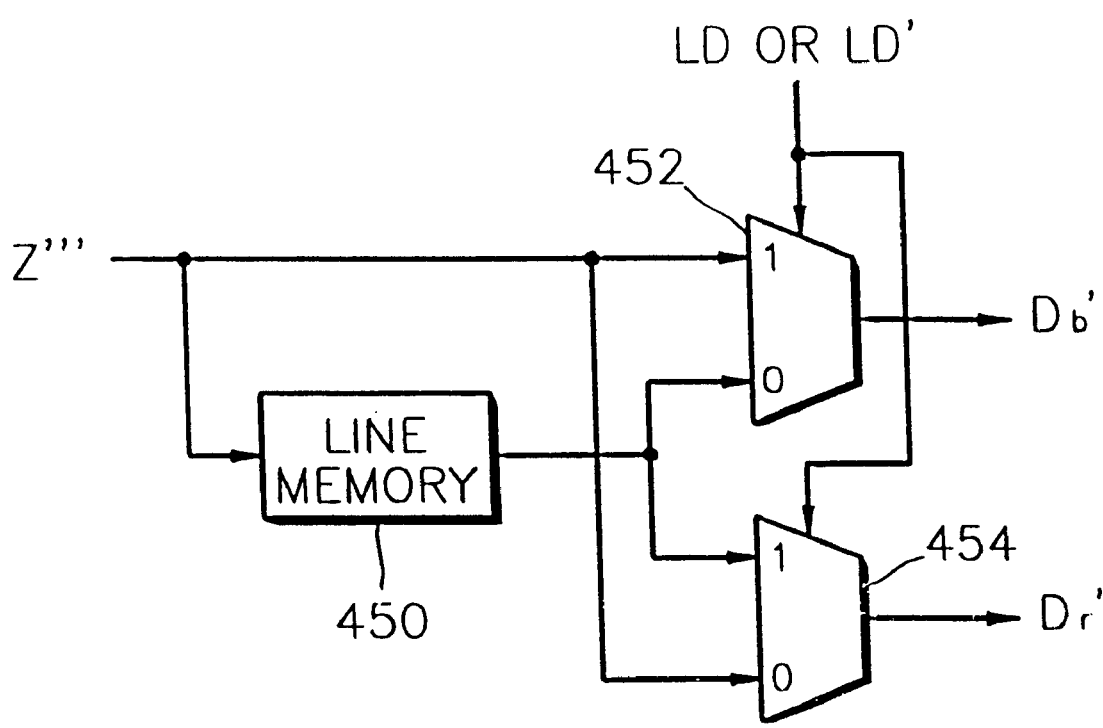
FIG. 17 is a circuit diagram of an example of the first, second, third or fourth color difference signal reproducer according to the embodiment of the present invention.

FIG. 17 is a circuit diagram of the first, second, third or fourth color difference signal reproducer 108, 168, 308 or 348. The color difference signal reproducer of FIG. 17 comprises a line memory 450 and multiplexers 452 and 454.

In FIG. 17, the line memory 450 stores the signal Z for the previous line. That is, the line memory 450 stores the Z signal for the previous line, output from the fourth, sixth, eighth or tenth de-emphasizer 112, 172, 312 or 352. Here, the multiplexer 452 selectively outputs one of the Z signal for the current line output from the corresponding de-emphasizer or the Z signal for the previous line stored in the line memory 450, as the frequency-demodulated first color difference signal $D_b'$, in response to the check result LD or LD'. Further, the multiplexer 454 selectively outputs the other of the Z signal for the current line, or the Z signal for the previous line stored in the line memory 450 (i.e., the one not selected by the multiplexer 452), as the frequency-demodulated second color difference signal $D_r'$, in response to the check result LD or LD'. For example, if the multiplexer 452 selects the Z signal stored in the line memory 450, the multiplexer 454 selects the Z signal for the current line. Meanwhile, if the multiplexer 452 selects the Z signal for the current line, then multiplexer 450 selects the previous Z signal stored in the line memory 450. Here, the first and second color difference signals $D_b'$ and $D_r'$ are output in lines. That is, $D_b'=D_b(0) \sim D_b(n)$ and $D_r'$ $Dr(0) \sim D_r(n)$.

As described above, the frequency demodulation apparatus and the method thereof according to the present invention utilize the arcsin approximation, so the frequency is demodulated without the need for a phase locked loop (PLL) or a look up table, thereby reducing the volume of hardware and the manufacturing costs. Also, the frequency demodulation apparatus and the method thereof according to the present invention can be applied to demodulate the frequency of the color difference signals transmitted according to by the SECAM protocol.

While this invention has been particularly shown and described with references to preferred embodiments thereof, it will be understood by those skilled in the art that various changes in form and in details may be made therein without departing from the spirit and scope of the invention as defined by the appended claims.

I claim:

1. A frequency demodulation apparatus comprising:
   an analog-to-digital converter (ADC) for sampling a frequency-modulated analog signal to convert the frequency-modulated analog signal into a digital signal, and for outputting the sampled digital values;
   a first multiplier for multiplying a first and a second oscillation signals having a phase difference of substantially 90°, by the sampled digital values respectively, and for outputting the products as the signals $I_i$ and $Q_i$;
   a low pass filter for low-pass-filtering the signals $I_i$ and $Q_i'$ and for outputting the low-pass-filtered signals $I_i'$ and $Q_i'$;
   a first de-emphasizer for de-emphasizing the high-frequency components of the signals $I_i'$ and $Q_i'$ and for outputting the de-emphasized signals $I_i''$ and $Q_i''$; and
   a frequency differentiator for delaying the signals $I_i''$ and $Q_i''$, for multiplying and then subtracting the delayed signals, and for outputting the subtraction result as a frequency-demodulated digital signal Z.

2. The frequency demodulation apparatus of claim 1, wherein the frequency differentiator comprises:
   a first delay for delaying the signal $I_i''$ and for outputting the delayed result;
   a second delay for delaying the output of the first delay and for outputting the result;
   a third delay for delaying the signal $Q_i''$ and for outputting the delayed result;
   a fourth delay for delaying the output for the third delay and for outputting the result;
   a second multiplier for multiplying the output of the second delay by the output of the third delay and for outputting the product;
   a third multiplier for multiplying the output of the first delay by the output of the fourth delay and for outputting the product; and a subtractor for subtracting the product of the second multiplier from the product of the third multiplier and for outputting the subtraction result as the signal.

3. The frequency demodulation apparatus of claim 1, wherein the first de-emphasizer is positioned between the analog-to-digital converter and the first multiplier, and wherein the first de-emphasizer de-emphasizes the high-frequency components of the sampled value $S_i$, and outputs the de-emphasized result to the first multiplier.

4. The frequency demodulation apparatus of claim 1 for SECAM chroma demodulation, further comprising:

a first selector for selectively outputting the signals $I_i''$ and $Q_i''$ or the signals $I_i'$ and $Q_i'$ in response to a selection signal;

a gain adjustor for determining whether the amplitude of the signal $I_i'$ maintains a predetermined value, adjusting the gain of the signal $I_i'$ in response to the check result, and outputting the gain-adjusted signal to the first multiplier;

a line checking unit for checking whether the current line is an even line or odd line using the signal Z, the selection signal and the delayed signals, and outputting the check result;

a gain corrector for correcting the gain of the signal Z;

a second de-emphasizer for de-emphasizing the low-frequency component of the signal output from the gain corrector, and outputting the de-emphasized result; and a color difference signal reproducer for differentiating and outputting the signals for the previous line among the signals output from the second de-emphasizer as a frequency-demodulated first color difference signal and for differentiating and outputting the signals for the current line among the signals output from the second de-emphasizer as a frequency-demodulated second color difference signal, in response to the check result of the line checking unit, wherein the analog signal includes the frequency-modulated first or second color difference signal, the color difference signal transmitted being loaded on the odd or even line, the frequency differentiator calculates the signal Z using the result selected by the first selector, the first multiplier multiplies the signals $I_i$ and $Q_i$ by the gain adjusted by the gain adjustor and outputs the products to the low pass filter, the gain corrector corrects the gain and offset of the signal Z in response to the check result of the line checking unit and outputs the corrected result to the second de-emphasizer, and the selection signal is generated during the interval in which a color burst signal exists in the analog signal.

5. The frequency demodulation apparatus of claim 4, wherein the first de-emphasizer and the first selector are positioned between the analog-to-digital converter and the first multiplier, and wherein the first de-emphasizer de-emphasizes the high-frequency component of the sampled digital values; and outputs the result to the first selector.

6. The frequency demodulation apparatus of claim 4, wherein the line checking unit comprises:

a latch for latching the signal Z in response to the selection signal;

a frequency detecting unit for detecting the frequency of the color burst signal to using the delayed results and the signal Z latched by the latch; and a comparator for comparing the frequency of the color burst signal with a predetermined frequency and outputting the comparison result as the check result.

7. The frequency demodulation apparatus of claim 6, wherein the predetermined frequency is the average of the sub-carrier frequency of the analog signal having the first color difference signal and the sub-carrier frequency of the analog signal having the second color difference signal.

8. The frequency demodulation apparatus of claim 6, wherein the frequency detecting unit comprises:

a first square calculator for squaring the signal $I_i''$ having at least one delay;

a second square calculator for squaring the signal $Q_i''$ having at least one delay;

a first adder for adding the output of the second square calculator to the output of the first square calculator, and outputting the addition result;

an amplifier for amplifying the addition result of the first adder and outputting the amplified result; and a divider for dividing the signal Z latched by the latch by the output of the amplifier, and outputting the division result as the frequency of the color burst signal.

9. The frequency demodulation apparatus of claim 4, wherein the gain corrector comprises:

a second selector for selectively outputting one of the first and second gain values for the first and second color difference signals, in response to the check result of the line checking unit;

a third selector for selectively outputting one of the first and second offset values for the first and second color difference signals, in response to the check result of the line checking unit;

a fourth multiplier for multiplying the signal Z by the output of the second selector, and outputting the product; and a second adder for adding the product of the fourth multiplier to the output of the third selector, and outputting the addition result as the gain-adjusted and offset-compensated Z signal to the second de-emphasizer.

10. The frequency demodulation apparatus of claim 4, wherein the color difference signal reproducer comprises:

a line memory for storing the signals for the previous line;

a fourth selector for selectively outputting one of the signal for the current line or the signals for the previous line stored in the line memory as the frequency-demodulated first color difference signal, in response to the check result of the line checking unit; and a fifth selector for selectively outputting the other of the signals for the current line or the signals for the previous line stored in the line memory, not selected by the fourth selector, as the frequency-demodulated second color difference signal, in response to the check result.

11. The frequency demodulation apparatus of claim 1, wherein the first and second oscillation signals are sinusoidal.

12. The frequency demodulation apparatus of claim 1 further comprising a gain corrector for correcting the gain of the signal.

13. The frequency demodulation apparatus of claim 1 further comprising an oscillator for outputting the first and second oscillation signals.

14. A frequency demodulation method comprising the steps of:

(a) sampling a frequency-modulated analog signal to calculate sample values $S_0 \sim S_n$;

(b) multiplying first and second sinusoidal oscillation signals with a phase difference of substantially 90° by the sampled value $S_i$ ($0 \leq i \leq$ is n) respectively to obtain the products $I_i$ and $Q_i$;

(c) low-pass-filtering the signals $I_i$ and $Q_i$ to obtain the low-pass-filtered signals $I_i'$ and $Q_i'$;

(d) de-emphasizing the high-frequency components of the signals $I_i'$ and $Q_i'$ to obtain the de-emphasized signals $I_i''$ and $Q_i''$;

(e) delaying the signals $I_i''$ and $Q_i''$, multiplying and then subtracting the delayed signals to obtain a frequency-demodulated digital signal Z; and (f) correcting the gain of the frequency-demodulated digital signal Z.

15. The method of claim 14, wherein the step (e) comprises the sub-steps of:

(e1) first delaying the signals $I_i''$ and $Q_i''$;

(e2) second delaying the signals $I_i''$ and $Q_i''$ first delayed in the step (e1);

(e3) multiplying the first delayed signal $Q_i''$ of the step (e1) by the second delayed signal $I_i''$ of the step (e2) to obtain a first product, and multiplying the second delayed signal $Q_i''$ of the step (e2) by the first delayed signal $I_i''$ of the step (e1) to obtain a second product; and (e4) subtracting the first product from the second product to obtain the frequency-demodulated digital signal.

16. The method of claim 14, wherein the step (d) of de-emphasizing the high-frequency component of the sampled value $S_i$ is performed before the step (b) of multiplying.

17. The method of claim 14 further comprising correcting the gain of the frequency-demodulated digital signal Z.

18. A frequency demodulation method for the SECAM chroma demodulation, comprising the steps of:

(a) sampling an analog composite video baseband signal with a frequency-modulated first or second color difference signal to obtain sampled values $S_0 \sim S_n$;

(b) multiplying sinusoidal third and fourth oscillation signals having a phase difference of 90° by the sampled value $S_i$ ($0 \leq i \leq n$) respectively and obtaining the products $I_i$ and $Q_i$;

(c) low-pass-filtering the product signals $I_i$ and $Q_i$ to obtain the low-pass-filtered signals $I_i'$ and $Q_i'$;

(d) delaying the low pass-filtered signals $I_i'$ and $Q_i'$, multiplying and then subtracting the delayed signals to obtain a signal Z;

(e) determining whether the current line is an even line or odd line using the signal Z, the selection signal and the delayed signals;

(f) determining the signals Z for the previous line as a frequency-demodulated first color difference signal if the current line is an even line; and (g) determining the signals Z for the current line as a frequency-demodulated second color difference signal if the current line is an odd line, wherein the frequency-modulated first and second color difference signals are loaded on the odd or even line and transmitted.

19. The frequency demodulation method of claim 18, wherein the step (d) comprises the sub-steps of:

(d1) first delaying the signals $I_i'$ and $Q_i'$;

(d2) second delaying the signals $I_i'$ and $Q_i'$ first delayed in the step (d1);

(d3) multiplying the first delayed signal $Q_i'$ of the step (d1) by the second delayed signal $I_i'$ of the step (d2) to obtain a third product, and multiplying the second delayed signal $Q_i'$ of the step (d2) by the first delayed signal $I_i'$ of the step (d1) to obtain a fourth product; and (d4) subtracting the third product from the fourth product to obtain the signal Z.

* * * * *

UNITED STATES PATENT AND TRADEMARK OFFICE
CERTIFICATE OF CORRECTION

PATENT NO. : 6,438,179 B1
DATED : August 20, 2002
INVENTOR(S) : In-jun Hwang

It is certified that error appears in the above-identified patent and that said Letters Patent is hereby corrected as shown below:

Column 17,
Line 3, insert -- $Z$ -- after "signal".
Line 63, delete "to" after "signal".

Column 18,
Line 65, delete "sample" and insert -- sampled --.

Column 19,
Line 1, delete "($0 \leq i \leq$is n)" and insert -- ($0 \leq i \leq n$) --.

Column 20,
Line 12, delete "Z." and insert -- Z, --".

Signed and Sealed this

First Day of July, 2003

JAMES E. ROGAN
*Director of the United States Patent and Trademark Office*